United States Patent Office 3,740,224
Patented June 19, 1973

3,740,224

PHOTOSENSITIVE COMPOSITIONS FOR THE PRODUCTION OF PRINTING PLATES

Helmut Barzynski, Lambsheim, and Carl Heinrich Krauch, Heidelberg, Germany, assignors to Badische Anilin- & Soda-Fabrik Aktiengesellschaft, Ludwigshafen (Rhine), Rhineland-Pfalz, Germany No Drawing. Filed July 13, 1971, Ser. No. 162,273
Claims priority, application Germany, July 18, 1970, P 20 35 848.9
Int. Cl. G03f *7/02;* G03c *1/68*
U.S. Cl. 96—33 4 Claims

ABSTRACT OF THE DISCLOSURE

Photosensitive compositions based on ethylene oxide polymers, polycarboxylic acids, olefinically unsaturated monomers and additions of photoinitiators and polymerization inhibitors.

The photosensitive compositions of the invention are suitable for the preparation of printing plates.

This invention relates to photosensitive compositions for the production of printing plates by coating a substrate with such compositions and exposing the coated substrate. The invention relates in particular to photosensitive compositions for the preparation of planographic printing plates and to the manufacture of such plates.

Photosensitive compositions for the preparation of lithographic plates for offset printing are known per se.

In offset printing processes, which are preferably used in the art, soluble polymeric compounds are made insoluble by photo-induced crosslinking using for example diazo compounds or chromates. The unexposed areas are then washed out and there is thus obtained a planographic printing relief. In such processes, the photosensitive film is applied to a water-wettable support.

For short runs and prints of not particularly high quality the support used consists of dimensionally stable paper coated with a substance, such as sodium carboxymethylcellulose, for improving its affinity to water. For high-quality prints and a large number of impressions the support is made of metal, preferably zinc, aluminum on chromium, having a roughened and/or etched surface.

The aforementioned processes have a number of disadvantages, for example several operations, such as developing and fixing, are necessary after exposure.

The grained metal surface is extremely sensitive to corrosion and scratches. It is therefore necessary to protect it by applying a coating of, say, sodium carboxymethylcellulose. Another drawback is that, when a halftone negative is used, an irregular shape is imparted to the individual dots by the rough surface of the metal support.

There are at present only a few processes in which a hydrophilic film becomes hydrophobic by exposure to light. One such process called "collotype" reproduces gray shades without the use of a screen. In this process a photosensitive gelatine layer is progressively hardened by incident light. However, since the gelatine layer is of low mechanical strength, printing plates having such a layer can only be used for short-run work. Furthermore, water absorption of the gelatine changes during printing with the result that shifts in the tonal values which are difficult to control may occur.

In a recently disclosed process for the manufacture of printing plates (German printed application No. 1,447,-977), a hydrophilic layer consisting of a mixture of polyethylene oxide and a phenolic resin, to which an organic sulfonic acid has been added, is rendered hydrophobic by exposure to light in the presence of ammonium bichromate. A disadvantage of this process is that no corrections can be made to the plate once it has been exposed. Another disadvantage is that the exposure times are unsatisfactory.

It is an object of the present invention to provide a suitable composition for the preparation of a photosensitive layer which may be applied in a simple manner to any dimensionally stable support such as wood, paper, metal or plastics material, it being possible to use the coated support as a lithographic plate immediately after exposure without development. It is another object of the present invention to provide a method of manufacturing lithographic plates which have adequate mechanical strength for the production of a relatively large number of impressions by planographic printing techniques. Moreover, the said printing plates should be suitable for exposure through both halftone negatives and continuous tone negatives. They should also be superior to collotype printing plates as regards the maximum possible number of impressions and resistance to shifts in the tonal values during printing.

We have now found that photosensitive mixtures based on an intimate blend of (A.1) from 15 to 80% by weight of a water-soluble linear ethylene oxide polymer having a molecular weight of at least 20,000 and recurring ether groups in the main chain of the molecule, (A.2) from 20 to 85% by weight of a polycarboxylic acid which is soluble or swellable in water or aqueous alkali and has a molecular weight of at least 500, the content of carboxyl groups therein being at least 5% by weight based on the polymeric polycarboxylic acid, and (B) olefinically unsaturated monomers which are compatible with the mixture of A.1 and A.2, boil at temperatures not below 100° C. at atmospheric pressure and which contain at least one photopolymerizable olefinically unsaturted double bond, the amount of monomers B being from 3 to 60% by weight of the mixture of A.1, A.2 and B, undergo a gradual change in their critical surface tension (for definition see for example "Contact Angle, Wettability, and Adhesion" in Advances in Chemistry Series 43, 1964) during photopolymerization and are outstandingly suitable for the preparation of printing plates, especially lithographic plates. We have also found that the such printing plates can be produced quickly and simply by applying a thin film based on the said photosensitive mixture to dimensionally stable supports and, if necessary, drying for a short period at a temperature of from 60° to 130° C., at which no polymerization takes place in the mixture, and then exposing the layer under a negative or positive which is at least partly transparent, no development being necessary. The gray shades of the image-bearing transparency need not be split up into dots for this process but can be reproduced directly on the printing plate. Another advantage of the present process is that the exposure of the composition for the purpose of producing a printing plate need only be short and generally takes less than 90 seconds. Planographic printing plates produced using the photosensitive compositions of the invention are able, on account of their good mechanical strength, to be used for relatively long runs and exhibit good resistance to shifts in the tonal values during printing. Furthermore, corrections can be made to the finished, i.e. exposed, plates by removing parts of the film with a suitable solvent such as aqueous or alcoholic sodium hydroxide or potassium hydroxide solutions followed by re-coating and re-exposure. A further advantage of the photosensitive mixtures of the invention is that they adhere well to different types of support.

The composition of the invention consists essentially of (A) from 40 to 97%, particularly from 55 to 85%, by weight of a blend of
- (A.1) from 15 to 80%, particularly from 30 to 50%, by weight of a water-soluble linear ethylene oxide polymer having a molecular weight of at least 20,000 and recurring ether groups in the main chain of the molecule, and
- (A.2) from 20 to 85%, particularly from 50 to 70%, by weight of a polycarboxylic acid which is soluble or swellable in water or aqueous alkali and has a molecular weight of at least 500, the content of carboxyl groups therein being at least 5%, preferably at least 20%, by weight of the polymeric polycarboxylic acid, and (B) from 3 to 60%, particularly from 15 to 45%, by weight of at least one monomer which is compatible with blend A (A.1+A.2), does not boil below 100° C. at atmospheric pressure and has more than one photopolymerizable olefinically unsaturated double bond. Mixtures of such monomers may also be used.

The blend consisting of A.1 and A.2 is usually and preferably in the form of an associate.

Suitable water-soluble linear ethylene oxide polymers having recurring $—CH_2—CH_2—O—$ units in the main chain of the molecule and generally having a molecular weight of from 20,000 to 20 million are, apart from the preferred ethylene oxide homopolymers, ethylene oxide copolymers containing minor quantities, preferably from 2 to 25 mol percent of other alkylene oxides such as 1,2-propylene oxide, 1,2-butylene oxide, styrene oxide, epichlorohydrin, butadiene-1,2-monoxide, glycidyl ethers and glycidyl esters of aliphatic carobxylic acids, particularly olefinically unsaturated carboxylic acids having from 3 to 5 carbon atoms, such as glycidylallyl ether, glycidyl acrylate and glycidyl methacrylate, provided that such copolymers are soluble in water. It is often advantageous to use comonomers which introduce lateral olefinic groups into the polymer molecule and thus facilitate crosslinking of the blend during exposure.

Particularly suitable polycarboxylic acids having a molecular weight of at least 500 and containing at least 5% by weight of —COOH— groups are homopolymers and copolymers of homopolymerizable or copolymerizable olefinically unsaturated carboxylic acids having from 3 to 12 carbon atoms, particularly from 3 to 6 carbon atoms, such as acrylic, methacrylic, crotonic, aconitic, citraconic, maleic, fumaric, methyleneglutaric and cinnamic acids and $C_1$ to $C_8$ alkyl half-esters of maleic acid, fumaric acid and the other polycarboxylic acids mentioned above, provided they are soluble or at least swellable in water or aqueous alkali. Polyacrylic acids are preferred. Also very suitable are the copolymers of acrylic acid or methacrylic acid with maleic anhydride, which have been subsequently hydrolyzed or reacted with aliphatic hydroxyl compounds having from 1 to 8 carbon atoms. In one advantageous embodiment, say from 60 to 80 mol percent of acrylic acid is copolymerized with from 2 to 40 mol percent of maleic anhydride by a conventional precipitation polymerization process. Polycarboxylic acids and in particular copolymers of olefinically unsaturated carboxylic acids having from 3 to 5 carbont atoms, which contain from 5 to 30 mol percent of building blocks having lateral photopolymerizable olefinic double bonds have been found to be very suitable. Such polycarboxylic acids may be advantageously prepared for example by reacting copolymers consisting of from 60 to 80 mol percent of acrylic or methacrylic acid and from 20 to 40 mol percent of maleic anhydride with hydroxyl-containing olefinically unsaturated compounds, such as monoacrylates or monomethacrylates of aliphatic diols having from 2 to 8 carbon atoms, for example ethylene glycol monomethacrylate or 1,4-butanediol monoacrylate, or with allyl alcohol. Polycarboxylic acids of the latter type increase the drop in hydrophily of the mixture during exposure due, probably, to increased crosslinking caused by photopolymerization. Suitable olefinically unsaturated monomers are preferably monomers having more than one photopolymerizable olefinic double bond. These may be used in admixture with each other or in admixture with minor quantities of monoolefinically unsaturated monomers, but the latter should not generally be present in an amount of more than 30%, preferably not more than 20%, by weight of the total amount of monomers. The monomer or monomer mixture should boil at 100° C. or above at atmospheric pressure and should be substantially compatible with the blend of A.1 with A.2 to enable a stable intimate mixture to be obtained therewith. Very suitable are monomers having a number of olefinically unsaturated double bonds and containing polar groups such as amide, methane and ester groups, such as the bisacrylamides or bismethacrylamides of diamines having from 2 to 12 carbon atoms, e.g. hexamethylene-1,6-bisacrylamide, butylene-1,4-bismethacrylamide, m-xylylene-bisacrylamide, methylene-bis-(meth) acrylamide, the reaction products (diethers) of 1 mole of an aliphatic diol having from 2 to 8 carbon atom with 2 moles of N-methylolacrylamide or N-methylolmethacrylamide, e.g.

$$CH_2{=}CH—CO—NH—CH_2—O—CH_2—CH_2—O—CH_2—NH—CO—CH{=}CH_2$$

reaction products from 2 moles of mono(meth)acrylates of aliphatic diols having from 2 to 8 carbon atoms, such as 1,4-butanediol monoacrylate, with 1 mole of a diisocyanate, such as toluylene diisocyanate, i.e. monomers having 2 olefinic double bonds, 2 ester groups and 2 urethane groups in the molecule, di-, tri and poly-acrylates of polyhydric alcohols or phenols having from 2 to 12 carbon atoms, e.g. trimethylolpropane diacrylate and trimethylolpropane triacrylate, maleic or fumaric half-esters of polyhydric alcohols containing at least 2 C=C bonds in the monomeric molecule and triallyl cyanurate and 1,3,5-triacryloylperhydrotriazine.

Suitable monoolefinic monomers which are added in small quantities in some cases include acrylamide, methacrylamide, N-methylol(meth)acrylamide and their ethers with alcohols having from 1 to 8 carbon atoms, mono (meth)acrylates of aliphatic diols or polyols having from 2 to 12 carbon atoms, such as 1,4-butanediol monoacrylate and diethyleneglycol monomethacrylate and monoesters of said diols or polyols with maleic acid or fumaric acid, such as triethyleneglycol monomaleate.

It is preferred to add to the mixture of A.1, A.2 and B a photoinitiator, i.e. a compound which initiates polymerization under the action of light. Suitable photoinitiators of this kind are conventional compounds which decompose with the formation of free radicals under the action of light and thus have a polymerization-initiating action, such as are described by J. Kosar in "Light-Sensitive Systems," J. Wiley and Sons Inc., New York, pages 158–193. Examples of suitable photoinitiators are aromatic carbonyl compounds of the benzophenone type, particularly vicinal ketaldonyl compounds such as benzil and diacetyl; α-ketaldonyl alcohols such as benzoyl alcols, e.g. benzoin; acyloin ethers such a benzoin isopropyl ether and α-methylolbenzoinmethyl ether, β-substituted aromatic acyloins such as α-methylbenzoin, and α-ketocarboxylic acids, such as benzoylformic acid, which are used generally in amounts of from 0.01 to 20%, preferably in amounts of from 1 to 15%, by weight of the weight of the mixture of A.1, A.2 and B.

Suitable polymerization inhibitors are any of the conventional polymerization inhibitors, particularly anthraquinone, p-methoxyphenol, p-quinone, thiourea, copper (I) chloride, methylene blue, β-naphthylamine, sodium N-nitrosocyclohexylhydroxylamine, β - naphthol and phenols. They are advantageously used in amounts of from 0.01 to 1% by weight of the weight of the mixture of A.1, A.2 and B.

The photosensitive mixtures may also, if desired, contain dyes, e.g. indigoid dyes such as indigo-2,5-disulfonic acid in the form of dialkali metal salt, oxidizing agents and/or fillers without the character of the compositions of the invention being substantially changed.

Preparation of the compositions of the invention is preferably carried out by combining the components in dissolved form, suitable solvents being polar organic solvents such as lower alcohols, e.g. methanol, ethanol, propanol and n-butanol, formamide, dimethyl formamide, glacial acetic acid, dioxane, tetrahydrofuran and mixtures thereof.

The printing plates, particularly lithographic plates, are produced by applying the photosensitive compositions, advantageously in the form of solutions, to a dimensionally stable rigid or flexible support of metal, wood, plastics material or paper by a conventional method such as casting, spraying or centrifuging, the amount of composition applied being such that the layer of photosensitive composition remaining after the solvent or solvent mixture has been evaporated under subatmospheric or atmospheric pressure generally has a thickness of from 0.0004 to 4 mm. and preferably from 0.001 to 0.01 mm.

The coated support is advantageously dried, for example in a drying cabinet, for a short period at from 60° to 130° C. before it is exposed. The actual drying time and drying temperature used will depend on the nature of the composition and may be readily determined for each photosensitive composition by simple experiment. The printing plate is then exposed through an image-bearing transparency in conventional exposure equipment, advantageously for about 0.1 to 10 minutes. The exposure time depends on the concentration of initiator, the concentration of inhibitor, the drying time of the layer and the degree of polymerization of the polycarboxylic acid and the polyethylene oxide. It may be readily determined by simple experiment.

A printing plate prepared in this way, without further processing, gives a large number of good printed copies using a conventional offset press. The pH of the water used should not exceed 7.

The unexposed blank material is sensitive to light and must therefore be stored in the dark. It is possible, however, to make such material insensitive to light by omitting the photoinitiators from the composition of the invention; this material may be stored in daylight. Before exposure, the printing plate is sensitized by spraying a solution of a photoinitiator in an organic solvent or water onto it, and exposed after the solvent or water has evaporated.

Particularly suitable lamps for exposing the photosensitive compositions are lamps emitting light of a wavelength of from 300 to 700 mμ, such as xenon lamps, fluorescent tubes, mercury vapor lamps and carbon arc lamps.

The invention is illustrated by the following examples in which parts and percentages are by weight unless otherwise stated. Parts by weight bear the same relation to parts by volume as the kilogram to the liter.

EXAMPLE 1

62 parts of a polyacrylic acid (molecular weight above $10^4$) produced by precipitation polymerization of acrylic acid in benzene, 36 parts of the diether produced from 1 mole of ethylene glycol and 2 moles of N-methylolacrylamide, 24 parts of m-xylylene bisacrylamide, 5 parts of benzoinmethyl ether, 0.1 part of hydroquinone and 0.2 part of ammonium dichromate are dissolved in 3,000 parts by volume of dimethyl formamide at 60° C. Small amounts of insolubles are removed by filtration through glass wool. To this solution there is added a solution of 38 parts of polyethylene oxide having a molecular weight of $10^6$ in 2,000 parts by volume of dimethyl formamide. The solution is cast on a steel sheet in such an amount that a clear film having a thickness of 0.001 mm. is obtained after evaporation of the solvent. The plate is then dried in a drying cabinet for 12 minutes at 90° C. The plate is exposed for 1 minute through a transparent halftone negative to produce a planographic printing plate which may be used immediately in an offset press and gives prints of good quality.

EXAMPLE 2

3 parts of acrylic acid and 0.1 part of potassium peroxide disulfate are dissolved in 50 parts of water and heated at 70° C. for 3 hours. The water is then removed in a rotary evaporator and the polyacrylic acid is dissolved in 10 parts by volume of tetrahydrofuran. To this solution there are added 3 parts of triethyleneglycol diacrylate, 3 parts of titanium dioxide, 0.5 part of benzoylformic acid and 0.02 part of methylene blue. 2 parts of polyethylene oxide having a molecular weight of $10^6$ is dissolved in 100 parts by volume of tetrahydrofuran at 60° C., and the two solutions are combined. The resulting solution is sprayed onto aluminum foil in such an amount that a film having a thickness of 0.0005 mm. is produced. Following evaporation of the tetrahydrofuran, the photosensitive aluminum foil is dried at 130° C. for 10 minutes. The foil is then exposed through a transparent continuous tone negative for 30 seconds to produce a printing plate which may be used in a small offset press and gives excellent printed copies with no shifts in the tonal values.

EXAMPLE 3

200 parts of a copolymer of maleic anhydride and styrene (molar ratio 1:1) are boiled under reflux with 600 parts by volume of ethanol until fully dissolved. The solution is then slowly added, while hot, to a solution of 200 parts of polyethylene oxide having a molecular weight of $10^6$, 160 parts of the diether derived from 1 mole of ethylene glycol and 2 moles of N-methylolacrylamide, 5 parts of benzoin isopropyl ether, 0.1 part of thiourea and 0.1 part of ammonium chromate in 2,500 parts by volume of dimethyl formamide. A strong, dimensionally stable paper is then coated with this solution. Following evaporation of the solvent, the coated paper is pre-exposed for 20 seconds and then immediately exposed under a transparent halftone negative for 90 seconds. The resulting lithographic plate may be used immediately and gives prints of excellent quality.

EXAMPLE 4

30 parts of maleic anhydride and 300 parts by volume of benzene are boiled under reflux. A solution of 70 parts of stabilizer-free acrylic acid and 0.1 part of azodiisobutyronitrile in 200 parts by volume of benzene is dripped in in the course of 3 hours. Reflux conditions are maintained for a further hour while stirring. The precipitated copolymer is filtered off and dried at 60° C. 50 parts of the copolymer are dispersed in 200 parts by volume of 1,4-butanediol monoacrylate and stirred at 30° C. for 7 hours until completely dissolved. The polymer is then precipitated by pouring the solution into 1,000 parts by volume of benzene, then filtered off and dried in a vacuum dryer at 30° C.

8 parts of the copolymer thus obtained from acrylic acid and the 1,4-butanediol monoacrylate half-ester of maleic acid are dissolved in 100 parts by volume of dimethyl formamide, following which 6 parts of trimethylolpropane triacrylate, 0.5 part of α-methylolbenzoinmethyl ether, 0.01 part of hydroquinone and 0.01 part of the disodium salt of 2,5-indigodisulfonic acid are added. To this solution there is added a clear solution of 4 parts of polyethylene oxide having a molecular weight of $8\times10^6$ in 200 parts by volume of dimethyl formamide. An aluminum plate which has been etched in a 30% by weight aqueous sodium hydroxide solution for 10 seconds to improve adhesion is coated with the solution by immersion therein and slow withdrawal (at 1 cm./min.) at room temperature. In this way a film thickness of 0.0015 mm. is obtained. The plate is then heated in a drying cabinet at 115° C. for 15 minutes.

The plate is exposed for 2 minutes through a halftone negative in conventional offset exposure apparatus to produce a planographic printing plate on which the image is clearly visible due to decolorization of the indigo dye in the exposed areas. This printing plate can produce in a small offset press 100,000 impressions of uniformly excellent quality.

We claim:

1. A manufacture for use in preparing planographic printing plates which comprises (1) a support; and (2) a thin layer of a photosensitive composition applied to said support;

said photosensitive composition being based on an intimate blend of (A.1) from 15 to 80% by weight of a water-soluble linear ethylene oxide polymer having a molecular weight of at least 20,000 and recurring ether groups in the main chain of the molecule, (A.2) from 20 to 85% by weight of a polycarboxylic acid which is soluble or swellable in water or aqueous alkali and has a molecular weight of at least 500, the content of carboxyl groups therein being at least 5% weight based on the polymeric polycarboxylic acid, and (B) olefinically unsaturated monomers which are compatible with the mixture of A.1 and A.2, boil at temperatures not below 100° C. at atmospheric pressure and contain at least one photopolymerizable olefinically unsaturated double bond, the amount of monomers B being from 3 to 60% by weight of the mixture of A.1 and A.2 and B which composition undergoes a photolytic reaction upon exposure to actinic radiation to produce a printing plate.

2. A manufacture as set forth in claim 1 wherein said photosensitive composition additionally contains of from 0.01 to 20% by weight (based on the mixture of A.1, A.2 and B) of a photoinitiator.

3. A manufacture as set forth in claim 1 wherein said photosensitive composition additionally contains of from 0.01 to 1% by weight (based on the mixture of A.1, A.2 and B) of a polymerization inhibitor.

4. A manufacture as in claim 1 wherein said polycarboxylic acid is a polymer of an olefinically unsaturated carboxylic acid having from 3 to 6 carbon atoms and a molecular weight of at least 500.

References Cited

UNITED STATES PATENTS

| | | | |
|---|---|---|---|
| 3,556,791 | 1/1971 | Suzuki et al. | 96—115 P |
| 3,661,576 | 5/1972 | Crary | 96—115 P |

NORMAN G. TORCHIN, Primary Examiner

E. C. KIMLIN, Assistant Examiner

U.S. Cl. X.R.

96—115 P